(12) United States Patent
Lee et al.

(10) Patent No.: US 10,517,155 B2
(45) Date of Patent: Dec. 24, 2019

(54) METHODS AND APPARATUS FOR VERTICALLY STACKED MULTICOLOR LIGHT-EMITTING DIODE (LED) DISPLAY

(71) Applicant: Massachusetts Institute of Technology, Cambridge, MA (US)

(72) Inventors: Kyusang Lee, Crozet, VA (US); Wei Kong, Cambridge, MA (US); Jeehwan Kim, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/156,250

(22) Filed: Oct. 10, 2018

(65) Prior Publication Data
US 2019/0053347 A1  Feb. 14, 2019

Related U.S. Application Data

(63) Continuation of application No. PCT/US2018/019392, filed on Feb. 23, 2018.
(Continued)

(51) Int. Cl.
*H01L 33/08* (2010.01)
*H05B 33/08* (2006.01)
(Continued)

(52) U.S. Cl.
CPC ......... *H05B 33/0857* (2013.01); *B32B 38/10* (2013.01); *C01B 32/188* (2017.08);
(Continued)

(58) Field of Classification Search
CPC ...... H01L 25/041; H01L 25/046; H01L 27/30
See application file for complete search history.

(56) References Cited

U.S. PATENT DOCUMENTS

| 2009/0236619 A1 | 9/2009 | Chakroborty |
| 2011/0030991 A1 | 2/2011 | Veerasamy |

(Continued)

FOREIGN PATENT DOCUMENTS

WO   WO 2017/044577   3/2017

OTHER PUBLICATIONS

Chun, J. et al., "Vertically Stacked Color Tunable Light-Emitting Diodes Fabricated Using Wafer Bonding and Transfer Printing," ACS Applied Materials & Interfaces, 6: 19482-19487 (2014); dx.doi.org/10.1021/am505415q.

(Continued)

*Primary Examiner* — Cheung Lee
(74) *Attorney, Agent, or Firm* — Wolf, Greenfield & Sacks, P.C.

(57) ABSTRACT

A method of fabricating a multicolor light-emitting diode (LED) display includes forming a first LED layer on a first release layer comprising a first two-dimensional (2D) material disposed on a first substrate. The first LED layer is configured to emit light at a first wavelength. The method also includes transferring the first LED layer from the first release layer to a host substrate and forming a second LED layer on a second release layer comprising a second 2D material disposed on a second substrate. The second LED layer is configured to emit light at a second wavelength. The method also includes removing the second LED layer from the second release layer and disposing the second LED layer on the first LED layer.

18 Claims, 19 Drawing Sheets

Related U.S. Application Data

(60) Provisional application No. 62/463,227, filed on Feb. 24, 2017.

(51) Int. Cl.
  *H01L 33/36* (2010.01)
  *C01B 32/188* (2017.01)
  *H01L 27/15* (2006.01)
  *B32B 38/10* (2006.01)
  *H01L 33/44* (2010.01)
  *H01L 27/30* (2006.01)
  *H01L 25/075* (2006.01)
  *H01L 33/00* (2010.01)

(52) U.S. Cl.
  CPC ........ *H01L 25/0756* (2013.01); *H01L 27/156* (2013.01); *H01L 27/30* (2013.01); *H01L 33/08* (2013.01); *H01L 33/36* (2013.01); *H01L 33/44* (2013.01); *B32B 2457/00* (2013.01); *H01L 33/0079* (2013.01)

(56) References Cited

U.S. PATENT DOCUMENTS

| | | | |
|---|---|---|---|
| 2014/0339580 A1 | 11/2014 | Park et al. | |
| 2015/0228728 A1 | 8/2015 | Dimitrakopoulos et al. | |
| 2016/0028022 A1* | 1/2016 | Seo | H01L 51/0072 257/40 |

OTHER PUBLICATIONS

International Search Report and Written Opinion dated Jul. 3, 2018 for International Application No. PCT/US2018/19392, 12 pages.
Invitation to Pay Additional Fees dated May 2, 2018 for Application No. PCT/US2018/019392.

\* cited by examiner

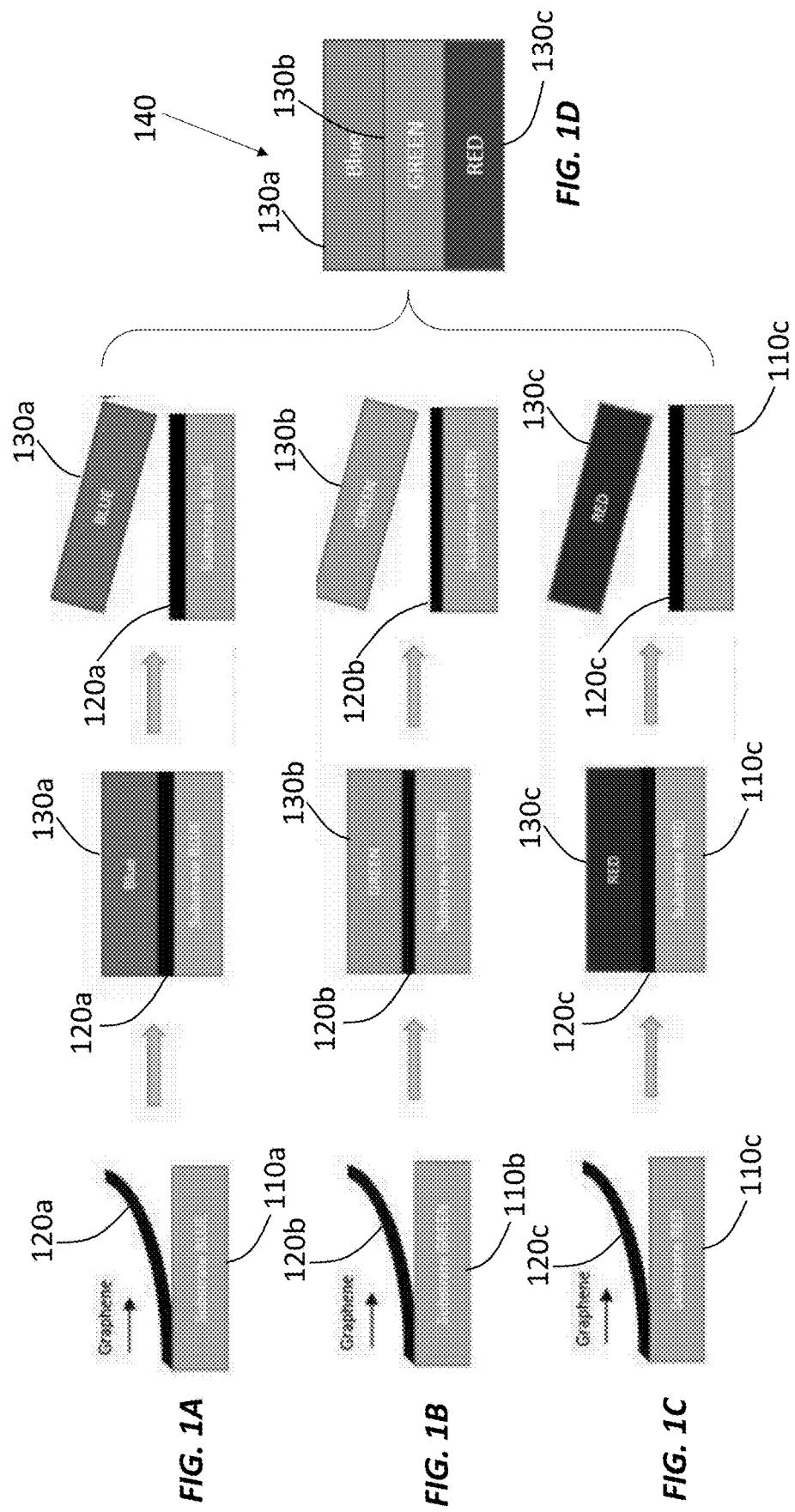

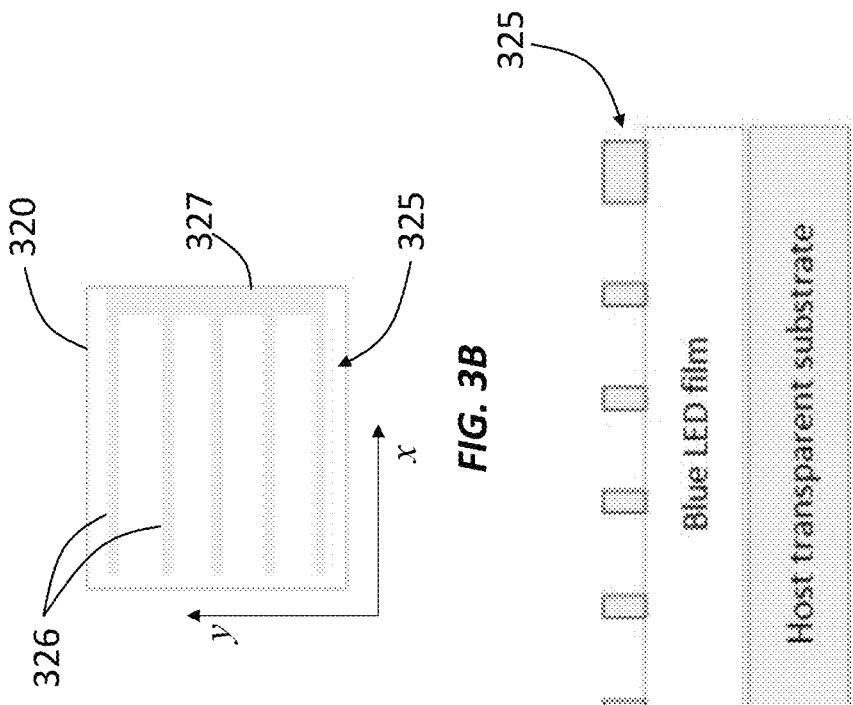
FIG. 3B
FIG. 3C
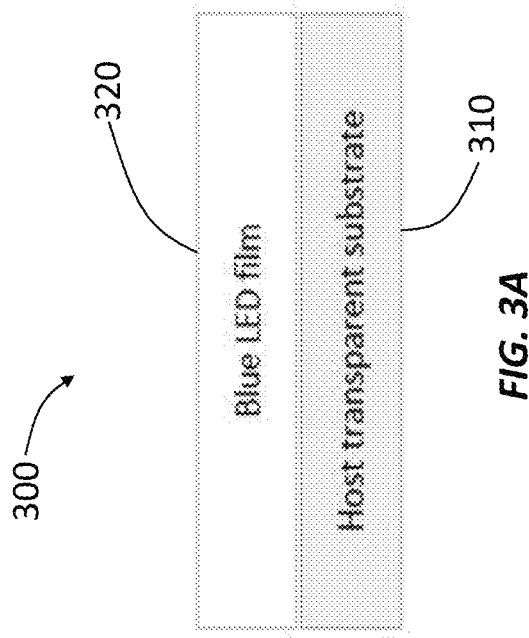
FIG. 3A

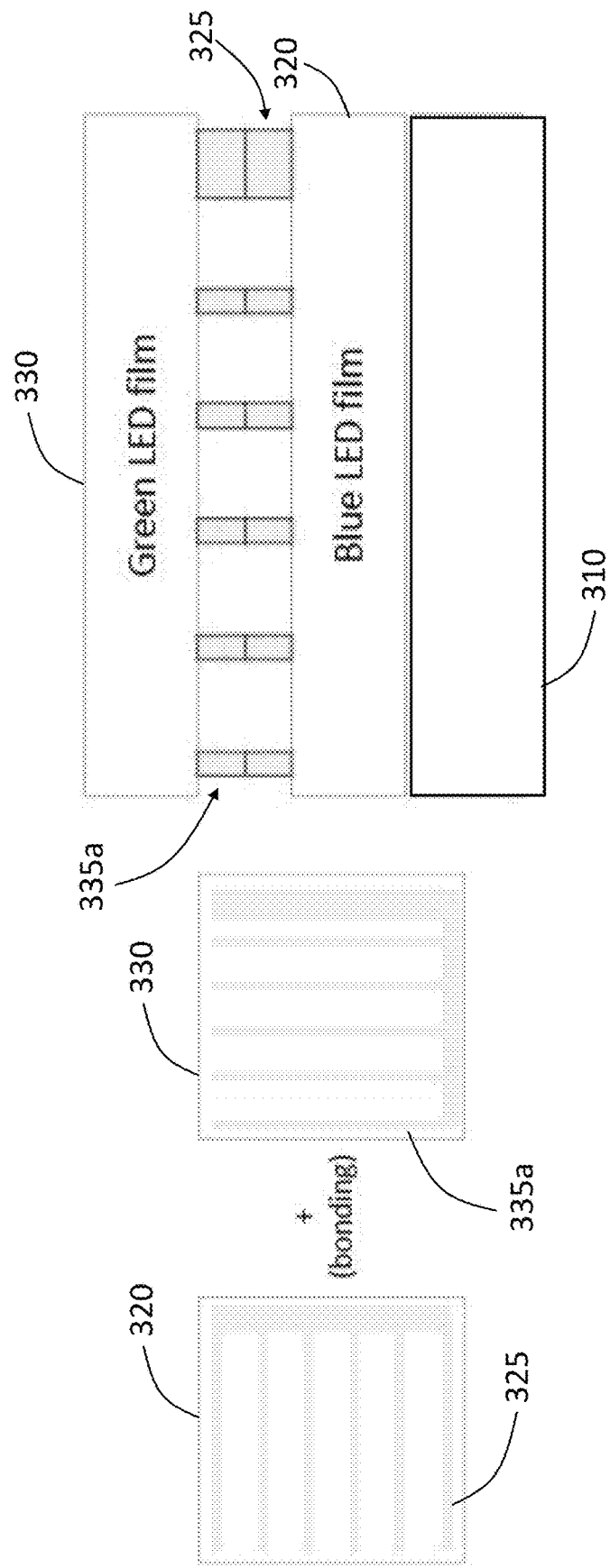

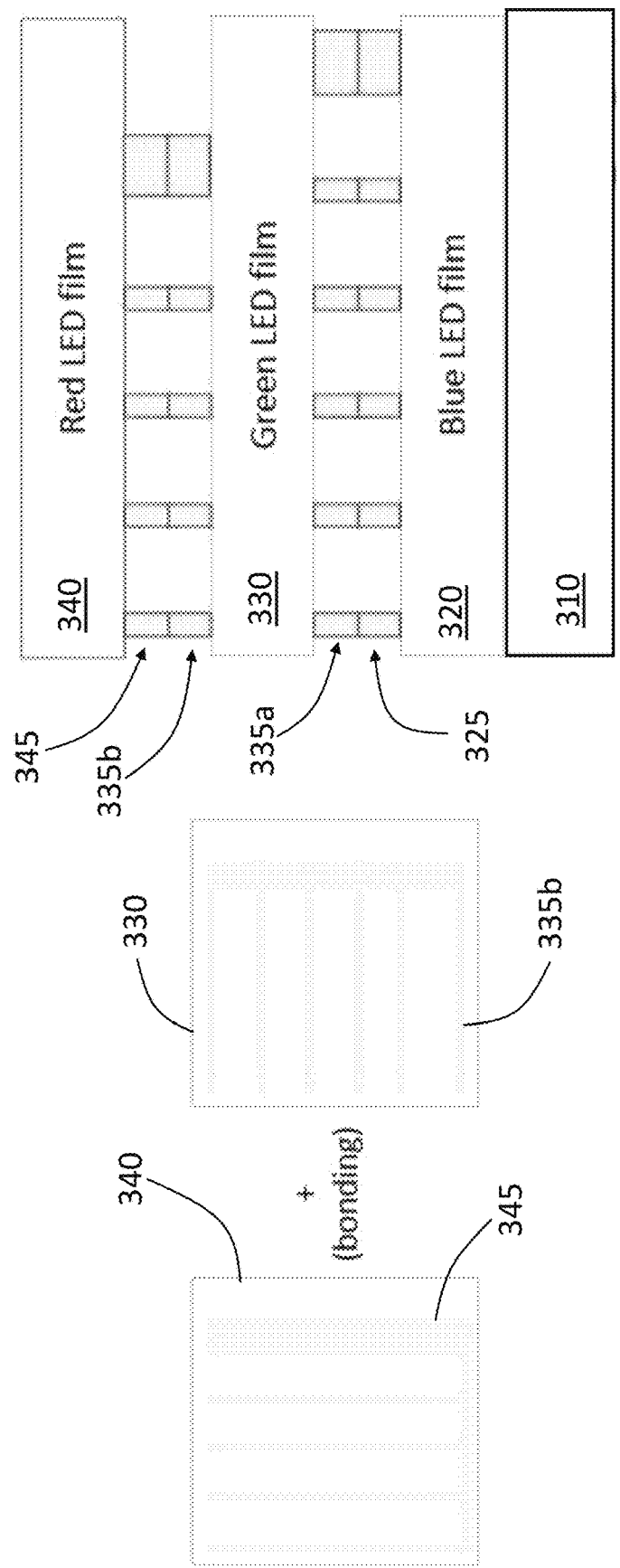

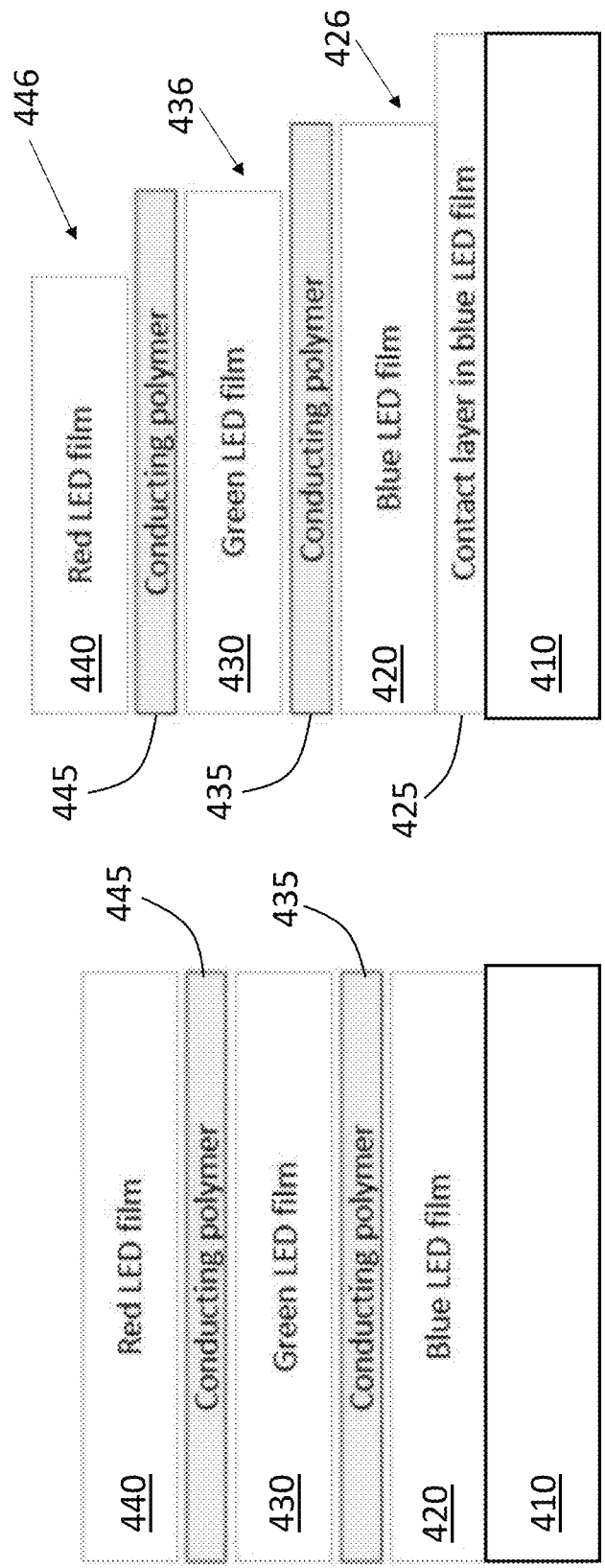

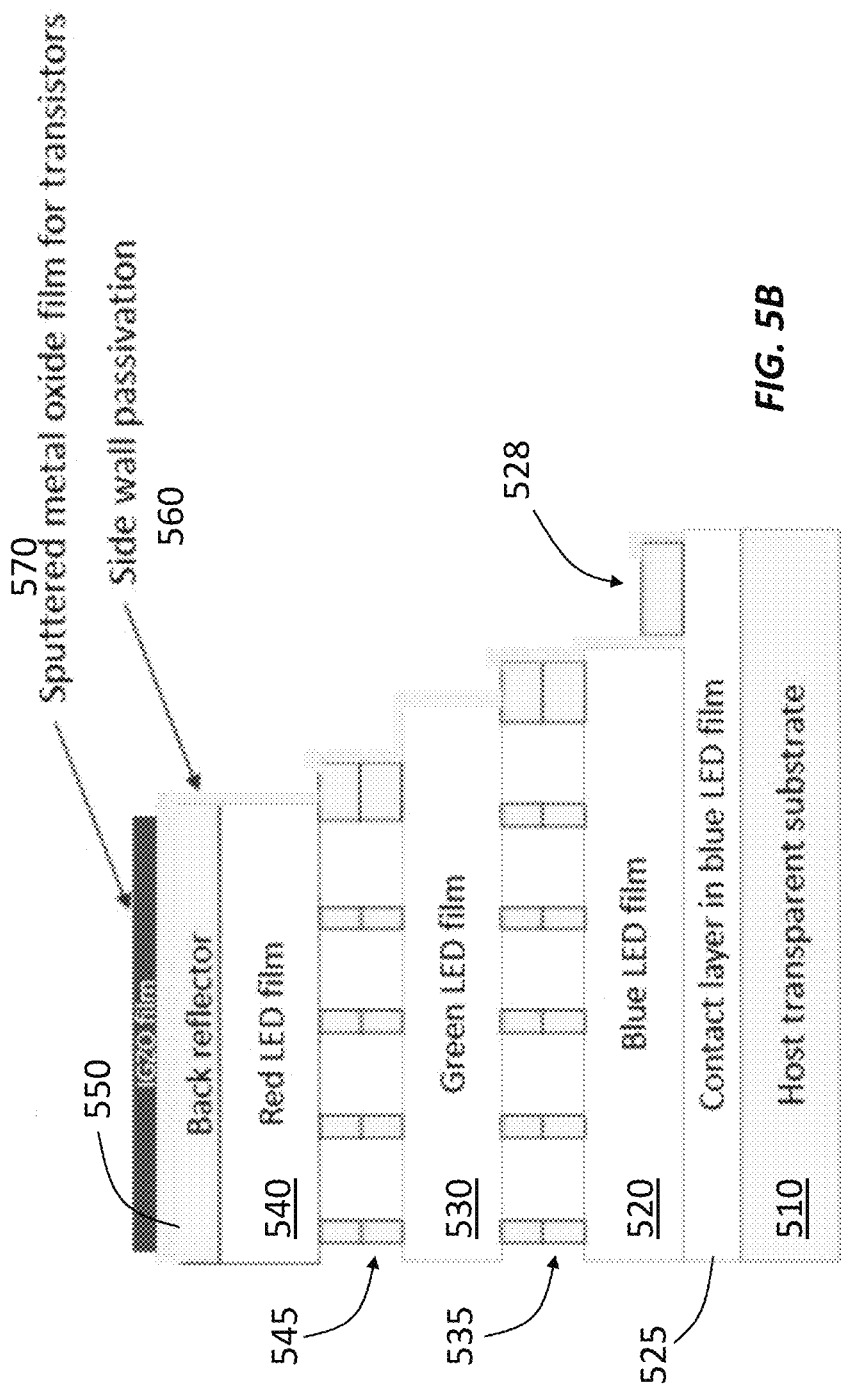

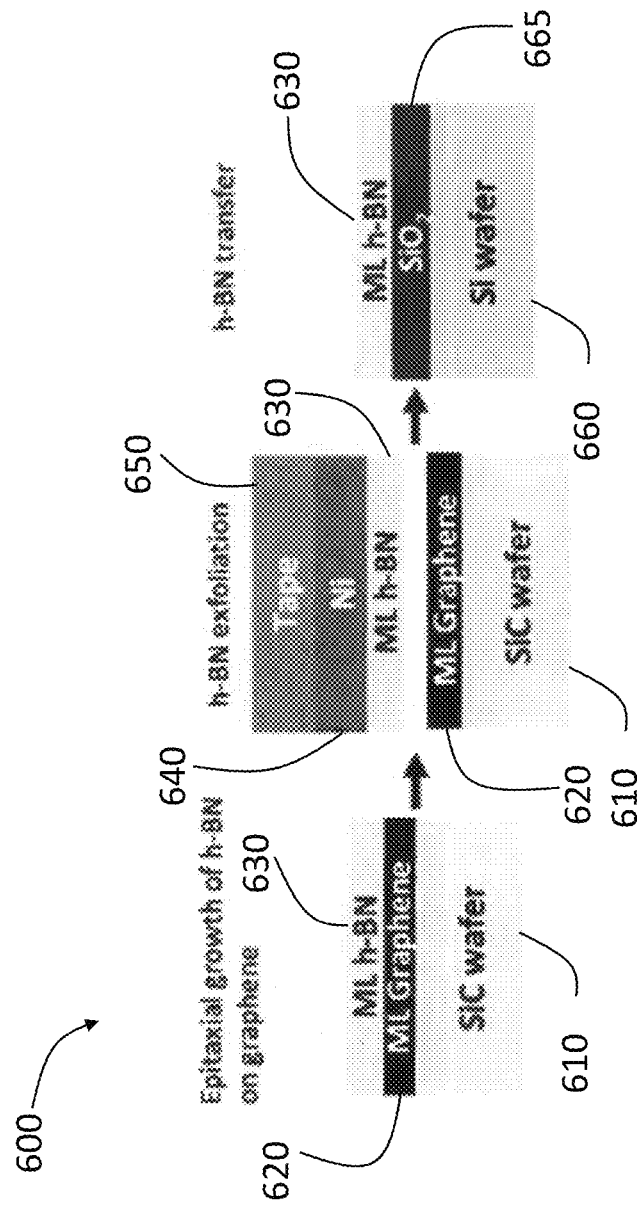

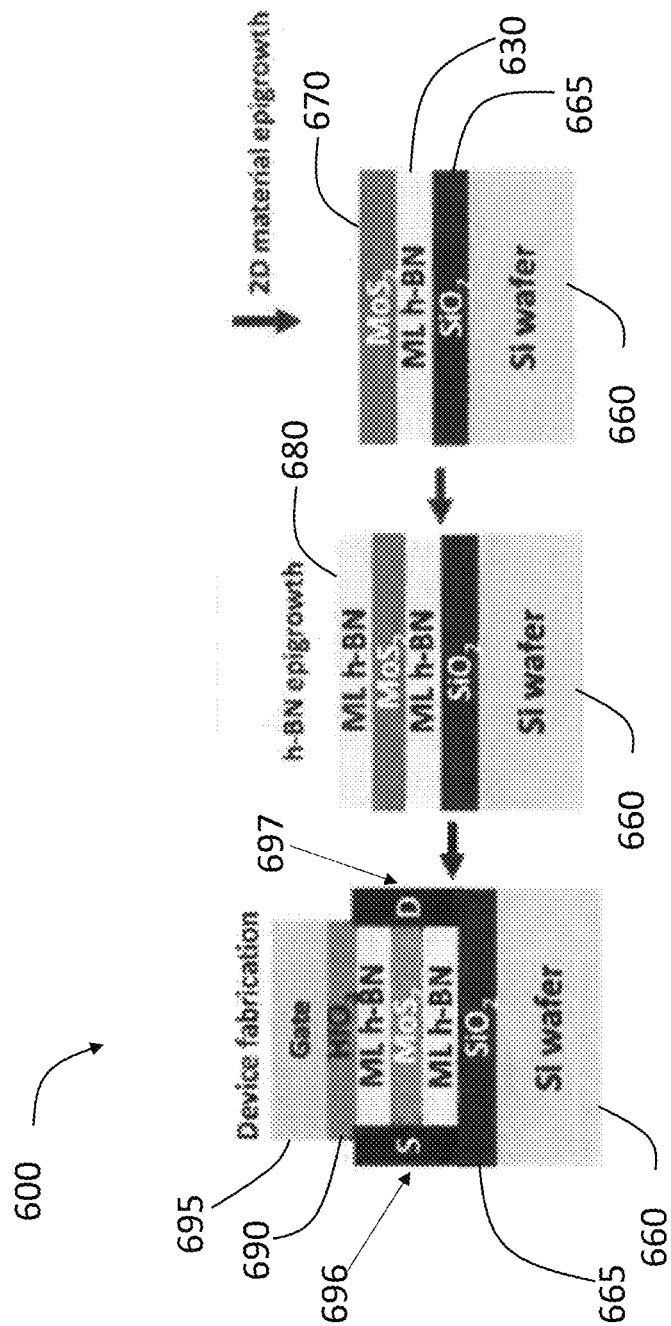

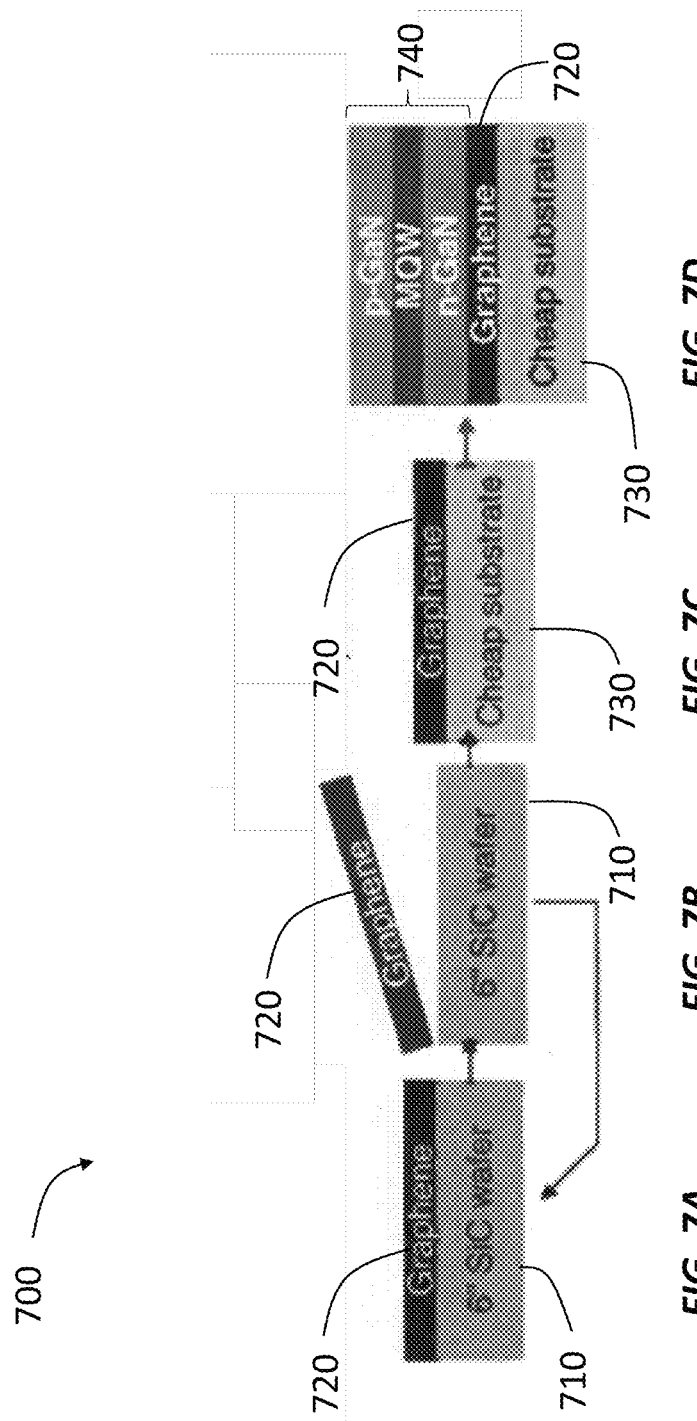

METHODS AND APPARATUS FOR VERTICALLY STACKED MULTICOLOR LIGHT-EMITTING DIODE (LED) DISPLAY

CROSS-REFERENCE TO RELATED APPLICATIONS

This application is a bypass continuation application of PCT Patent Application No. PCT/US2018/019392, filed Feb. 23, 2018, and entitled "METHODS AND APPARATUS FOR VERTICALLY STACKED MULTICOLOR LIGHT-EMITTING DIODE (LED) DISPLAY," which in turn claims a priority benefit, under 35 U.S.C. § 119(e), of U.S. Provisional Patent Application No. 62/463,227, filed on Feb. 24, 2017, and entitled "RGB VERTICAL STACKING THIN FILM SOLID-STATE MICRO LEDS DISPLAY," each of which applications is incorporated herein by reference in their entirety.

BACKGROUND

Light emitting diodes (LEDs) based on crystalline inorganic semiconductors provide numerous advantages, including high brightness, long lifetime, and high efficiency. This makes inorganic LEDs good candidates for display and lighting applications. Unfortunately, inorganic LEDs generally emit light at only one wavelength (i.e., a particular color), so using them for white light solid state lighting or polychromatic LED displays usually involves integration of multiple LEDs, each of which is configured to emit light at a distinct wavelength. For example, each pixel in an existing color LED display usually has three LED elements (or subpixels) to emit red, green, and blue light, respectively. These subpixels are aligned in next to each other, e.g., in a Bayer array. However, this parallel configuration increases the size of each pixel, thereby limiting the spatial resolution of the resulting display. In addition, since light from these subpixels is separate near the display surface and then mixed in the far field, the color accuracy of the display is also compromised.

SUMMARY

Embodiments of the present technology generally relate to vertically stacked light-emitting diodes (LEDs). In one example, a method of fabricating a multicolor light-emitting diode (LED) display includes forming a first LED layer on a first release layer comprising a first two-dimensional (2D) material disposed on a first substrate. The first LED layer is configured to emit light at a first wavelength. The method also includes transferring the first LED layer from the first release layer to a host substrate and forming a second LED layer on a second release layer comprising a second 2D material disposed on a second substrate. The second LED layer is configured to emit light at a second wavelength. The method also includes removing the second LED layer from the second release layer and disposing the second LED layer on the first LED layer.

In another example, a multicolor light-emitting diode (LED) display includes a transparent substrate, a first electrode layer disposed on the transparent substrate, and an array of pixels disposed on the first electrode layer. Each pixel in the array of pixels includes a first LED layer comprising a first crystalline inorganic semiconductor and configured to emit light at a first wavelength and a second electrode layer disposed on the first LED layer. A second LED layer is disposed on the second electrode layer. The second LED layer includes a second crystalline inorganic semiconductor and configured to emit light at a second wavelength different than the first wavelength. Each pixel also includes a third electrode layer disposed on the second LED layer and a third LED layer disposed on the third electrode layer. The third LED layer includes a third crystalline inorganic semiconductor and configured to emit light at a third wavelength different than the first wavelength and the second wavelength. Each pixel further includes a plurality of transistors disposed above the third LED layer. The plurality of transistors includes a first transistor electrically connected to the first electrode layer, a second transistor electrically connected to the second electrode layer, and a third transistor electrically connected to the third electrode.

In yet another example, a method of fabricating a multicolor light-emitting diode (LED) display includes forming a first LED layer on a first graphene layer disposed on a first substrate. The first LED layer includes a first crystalline inorganic semiconductor and configured to emit light at a first wavelength in a range of about 580 nm to about 760 nm. The method also includes transferring the first LED layer from the first graphene layer to a first electrode layer disposed on a host substrate, forming a second electrode layer on the first LED layer, and forming a second LED layer on a second graphene layer disposed on a second substrate. The second LED layer includes a second crystalline inorganic semiconductor and configured to emit light at a second wavelength in a range of about 490 nm to about 580 nm. The method also includes forming a third electrode layer on a first surface of the second LED layer and bonding the third electrode layer with the second electrode layer so as to couple the second LED layer to the first LED layer. The method further includes forming a fourth electrode layer on a second surface, opposite the first surface, of the second LED layer, and forming a third LED layer on a third graphene layer disposed on a third substrate. The third LED layer includes a third crystalline inorganic semiconductor and configured to emit light at a third wavelength in a range of about 390 nm to about 490 nm. The method also includes forming a fifth electrode layer on the third LED layer and bonding the fifth electrode layer with the fourth electrode layer so as to couple the third LED layer onto the second LED layer.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different FIGS. 1A-1D illustrate a method of fabricating vertically stacked multicolor light-emitting diode (LED) devices.

FIGS. 3A-3L illustrate a method of fabricating vertically stacked LED devices via electrode bonding.

FIGS. 4A-4E illustrate a method of fabricating vertically stacked LED devices using conductive polymers.

FIGS. 5A-5C show schematics of vertically stacked LED devices including transistors to control the operation.

FIGS. 6A-6F illustrate a method of fabricating transistors that can be used in the device shown in FIGS. 5A-5C.

FIGS. 7A-7H illustrate a method of fabricating LED devices using graphene-based layer transfer techniques.

DETAILED DESCRIPTION

Overview

Figure 2A:
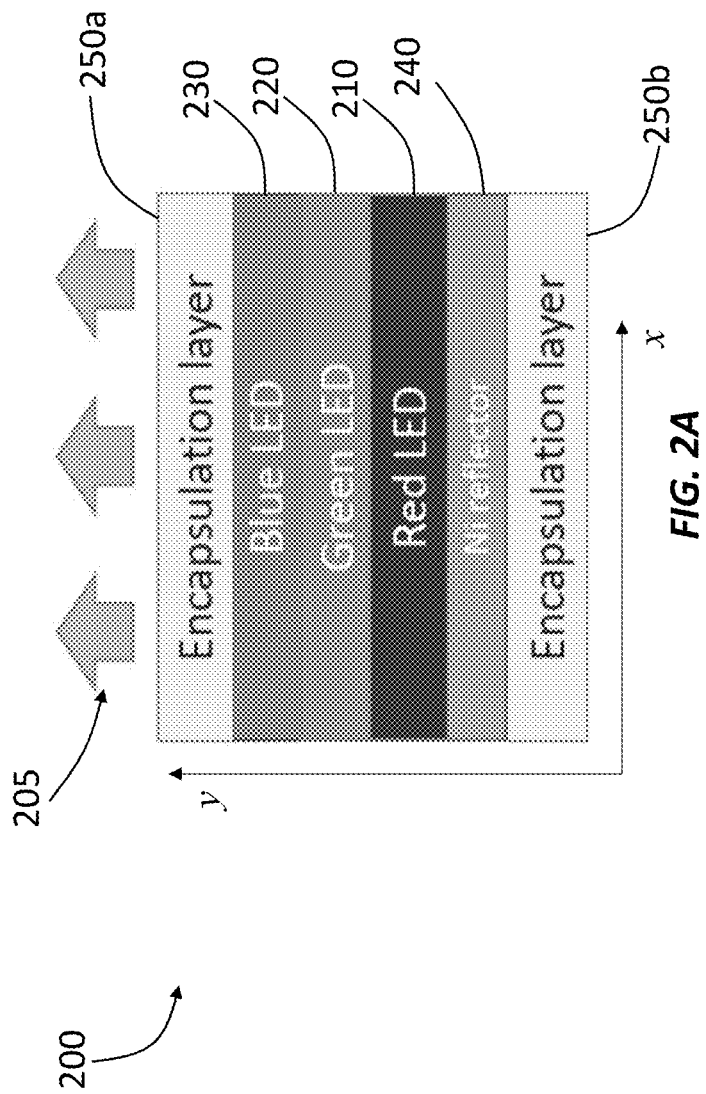
FIG. 2A shows a schematic of a vertically stacked LED device that can be fabricated via the method illustrated in FIGS. 1A-1D.

To address the drawbacks in conventional multicolor light-emitting diode (LED) lighting and displays, methods and apparatus described herein employ vertical stacking of red-green-blue (RGB) thin film solid-state LEDs for advanced displays and lighting application. In this approach, vertical stacking of thin film compound semiconductor LEDs can increase the pixel density and color accuracy compared to displays based on Bayer arrays. The vertical LED stacking is accomplished using a 2D material-based layer transfer process, in which individual LED layers (e.g., each emitting a distinct color) are synthesized on a release layer made of a 2D material (e.g., graphene) disposed on a fabrication substrate. The fabricated LED layers are then transferred (e.g., by exfoliation) to a host substrate, where they are stacked on top of each other to form a vertically stacked, multicolor LED structure. After the transfer, the platform including the fabrication substrate and the release layer can be reused to make another vertically stacked, multicolor LED structure in the next synthesis cycle, thereby reducing the manufacturing cost.

This vertical stacking approach can have several benefits. For example, the layer-transfer technique allows the growth and stacking of LED layers made of inorganic crystalline semiconductors, which usually have a higher efficiency compared to organic light emitting diodes (OLEDs). In addition, the host substrate can include flexible materials, such as elastomer, such that the resulting device can be adapted to arbitrary surfaces in applications such as wearable displays. The solid state of each individual LED layer can also ensure high mechanical strength of the resulting device. Furthermore, the vertical stacking can produce pixels having a small pixel size (e.g., 0.1 mm or less). With these benefits, the vertical stacking of thin film solid-state LEDs can be used in a wide range of applications, such as large area outdoor displays, wearable displays, and solid state lighting (e.g., street lights).

Methods of Fabricating Vertically Stacked LED Devices

FIGS. 1A-1D illustrate a method 100 of fabricating vertically stacked LED devices. In this method 100, a first release layer 120a is formed on a first substrate 110a, then a first LED layer 130a is formed on the first release layer 120a. The fabricated LED layer 130a is then removed from the first release layer 120a, leaving a platform including the first substrate 110a and the first release layer 120a for the next cycle of fabrication, as illustrated in FIG. 1A. The first LED layer 120a includes a first crystalline inorganic semiconductor configured to emit light at a first wavelength.

Similarly, FIG. 1B shows that a second release layer 120b is formed on a second substrate 110b, then a second LED layer 130b is formed on the second release layer 120b. The fabricated LED layer 130b is then removed from the second release layer 120b, leaving a platform including the second substrate 110b and the second release layer 120b for the next cycle of fabrication. The second LED layer 120b includes a second crystalline inorganic semiconductor configured to emit light at a second wavelength.

FIG. 1C shows that a third release layer 120c is formed on a third substrate 110c, followed by forming a third LED layer 130c on the third release layer 120c. The fabricated LED layer 130c is then removed from the third release layer 120c, leaving a platform including the third substrate 110c and the second release layer 120c for next cycle of fabrication. The third LED layer 120c includes a third crystalline inorganic semiconductor configured to emit light at a third wavelength.

After being removed from the corresponding release layers 120a, 120b, and 120c (collectively referred to as the release layers 120), the LED layers 130a, 130b, and 130c (collectively referred to as the LED layers 130) are stacked together to form a vertically stacked LED device 140, as shown in FIG. 1D. Since each LED layer 130a, 130b, or 130c is configured to emit light at a distinct wavelength (e.g., wavelengths corresponding to red, green, and blue light, respectively), the LED device 140 can emit light at any color by adjusting the amount of light emitted from each LED layer 130a, 130b, and 130c. FIG. 1D shows that the second LED layer 130b is sandwiched between the first LED layer 130a and the third LED layer 130c. Other configurations can also be used. For example, the first LED layer 130a can be disposed between the second LED layer 130b and the third LED layer 130c.

In addition, the device 140 may have only two LED layers, four LED layers, five LED layers, or any other number of LED layers. For example, the device 140 can include two LED layers: one is configured to emit yellow light and the other is configured to emit blue light. In another example, the device 140 can include four LED layers configured to emit red, green, blue, and yellow light, respectively. The thickness of each LED layer 130 can be about 1 µm to about 100 µm (e.g., about 1 µm, about 2 µm, about 3 µm, about 5 µm, about 10 µm, about 20 µm, about 30 µm, about 50 µm, or about 100 µm, including any values and sub ranges in between).

In one example, the device 140 can be further patterned into multiple pixels after the LED layers 130a, 130b, and 130c are stacked as shown in FIG. 1D. In another example, each LED layer 130a, 130b, and 130c can be pre-patterned before then are stacked together to form the LED device 140.

The first wavelength of light emitted by the first LED layer 130a can be anywhere from about 360 nm to about 490 nm. Accordingly, the first crystalline inorganic semiconductor can include, for example, gallium nitride (GaN), zinc selenide (ZnSe), indium gallium nitride (InGaN), or silicon carbide (SiC).

The second wavelength of light emitted by the second LED layer 130b can be about 490 nm to about 580 nm. The corresponding second crystalline inorganic semiconductor can include, for example, gallium(III) phosphide (GaP), aluminum gallium indium phosphide (AlGaInP), aluminum gallium phosphide (AlGaP), or indium gallium nitride (In-GaN)/Gallium(III) nitride (GaN).

The third wavelength of light emitted by the third LED layer 130c can be anywhere from about 580 nm to about 760 nm. Accordingly, the third crystalline inorganic semiconductor can include, for example, aluminum gallium arsenide (AlGaAs), gallium arsenide phosphide (GaAsP), aluminum gallium indium phosphide (AlGaInP), or gallium(III) phosphide (GaP).

The substrates 110a, 110b, and 110c (collectively referred to as LED growth substrates 110) can include the same semiconductor material as used in the respective LED layers 130a, 130b, and 130c. For example, the first substrate 110a and the first LED layer 130a can each be formed of the same crystalline inorganic semiconductor material. If the release layers 120 are thin enough (e.g. about 1 nm to about 10 nm), this configuration allows lattice matching between the LED growth substrates 110 and the LED layers 130. Therefore, the fabricated LED layers 130 can have high crystalline quality. For example, the density of defects, such as dislocations, can be on the order of about $10^4/cm^2$-$10^8/cm^2$. Alternatively, the LED growth substrates 110a/b/c may use a different material from the material of the corresponding LED layer 130a/b/c, in which case the growth of the LED layers 130 can be seeded by the release layers 120. More information about different seeding schemes can be found in PCT Application No. PCT/US2016/050701, filed Sep. 6, 2016, entitled "SYSTEMS AND METHODS FOR GRAPHENE BASED LAYER TRANSFER," which is hereby incorporated by reference in its entirety.

The release layers 120 include a two-dimensional (2D) material to facilitate the transfer of the fabricated LED layers 130 from the LED growth substrates 110 to a host substrate (not shown in FIGS. 1A-1D) for stacking. Various types of 2D materials can be used for the release layers 120. In one example, the release layers 120 include graphene (e.g., monolayer graphene or multilayer graphene). In another example, the release layers 120 include transition metal dichalcogenide (TMD) monolayers, which are atomically thin semiconductors of the type $MX_2$, with M being a transition metal atom (e.g., Mo, W, etc.) and X being a chalcogen atom (e.g., S, Se, or Te). In a TMD lattice, one layer of M atoms is usually sandwiched between two layers of X atoms. In yet another example, the release layers 120 can include a single-atom layer of metal, such as palladium and rhodium. The three release layers 120 can include the same material or different materials, depending in part on the materials of the LED layers 130.

Out of these 2D materials, graphene can have several desirable properties. For example, graphene is a crystalline film and is a suitable substrate for growing epitaxial overlayers. Second, graphene's weak interaction with other materials can substantially relax the lattice mismatching rule for epitaxial growth, potentially permitting the growth of most semiconducting films with low defect densities. Third, epilayers grown on a graphene substrate can be easily and precisely released from the substrate owing to graphene's weak van der Waals interactions, thereby allowing rapid mechanical release of epilayers without post-release reconditioning of the released surface. Fourth, graphene's mechanical robustness can increase or maximize its reusability for multiple growth/release cycles.

A release layer 120 including graphene is also referred to as a graphene layer 120 herein. In one example, a graphene layer 120 can be grown directly on the LED growth substrate 110. In another example, a graphene layer 120 can be grown on a separate substrate (also referred to as a graphene growth substrate) and then transferred to an LED growth substrate 110.

A graphene layer 120 can be fabricated on a separate substrate via various methods. In one example, the graphene layer 120 can include an epitaxial graphene with a single-crystalline orientation and the graphene growth substrate can include a (0001) 4H-SiC wafer with a silicon surface. The fabrication of a graphene layer 120 can include multiple annealing steps. A first annealing step can be performed in $H_2$ gas for surface etching, and a second annealing step can be performed in Ar for graphitization at high temperature (e.g., about 1,575° C.).

In another example, the graphene layers 120 can be grown on the graphene growth substrate via a chemical vapor deposition (CVD) process. The graphene growth substrate can include a nickel substrate or a copper substrate. Alternatively, the graphene growth substrate can include an insulating substrate of $SiO_2$, $HfO_2$, $Al_2O_3$, $Si_3N_4$, or practically any other high temperature compatible planar material by CVD.

In yet another example, the graphene growth substrate can be any substrate that can hold a graphene layer 120, and the fabrication can include a mechanical exfoliation process. In this example, the graphene growth substrate can function as a temporary holder for each graphene layer 120.

Various methods can also be used to transfer the graphene layers 120 from the graphene growth substrate to the LED growth substrates 110. In one example, a carrier film can be attached to a given graphene layer 120. The carrier film can include a thick film of Poly(methyl methacrylate) (PMMA) or a thermal release tape and the attachment can be achieved via a spin-coating process. After the combination of the carrier film and the graphene layer 120 is disposed on the LED growth substrate 110, the carrier film can be dissolved (e.g., in acetone) for further fabrication of one or more LED layers 130 on the graphene layer 120.

In another example, a stamp layer including an elastomeric material, such as polydimethylsiloxane (PDMS), can be attached to the graphene layer 120 and the graphene growth substrate can be etched away, leaving the combination of the stamp layer and the graphene layer 120. After the stamp layer and the graphene layers 120 are placed on the LED growth substrates 110, the stamp layer can be removed by mechanical detachment, producing a clean surface of the graphene layer 120 for further processing.

In yet another example, a self-release transfer method can be used to transfer a graphene layer 120 to a corresponding LED growth substrate 110. In this method, a self-release layer is first spin-cast over the graphene layer 120. An elastomeric stamp is then placed in conformal contact with the self-release layer. The graphene growth substrate can be etched away to leave the combination of the stamp layer, the self-release layer, and the graphene layer 120. After this combination is placed on the corresponding LED growth substrate 110, the stamp layer can be removed mechanically and the self-release layer can be dissolved under mild conditions in a suitable solvent. The release layer can include polystyrene (PS), poly(isobutylene) (PIB) and Teflon AF (poly[4,5-difluoro-2,2-bis(trifluoromethyl)-1,3-dioxole-co-tetrafluoroethylene]).

In some examples, the release layers 120 can be porous. A porous release layer 120 can be fabricated by patterning a 2D material layer. For example, a porous film (e.g., oxide, nitride, or photoresist film) can be disposed on an intact 2D material layer. The porous film can have a high density of pinholes (e.g., about one hole per square micron). Dry etching using Ar plasma or $O_2$ plasma can be then carried out to open up the pinholes, thereby allowing ions in the etching plasma to propagate through the porous film and arrive at the 2D material layer. The etching plasma then etches the portion of the 2D material layer directly underneath the pinholes in the porous film to create a porous release layer. The porous film can then be removed, leaving the porous release layer for further processing (e.g., growth of the LED layers 130). In one example, the porous film includes photoresist material and can be removed by acetone. In another example, the porous film includes oxide or nitride and can be removed by hydrogen fluoride (HF).

The fabrication of the LED layers 130 can be carried out via epitaxial growth using appropriate semiconductor fabrication technique known in the art. For example, low-pressure Metal-Organic Chemical Vapor Deposition (MOCVD) can be used to grow the LED layers 130 including GaN on the release layers 120, which in turn is disposed on the growth substrates 110. In this example, the release layers 120 and the growth substrates 110 can be baked (e.g., under $H_2$ for >15 min at >1,100° C.) to clean the surface. Then the deposition of the LED layers 130 including GaN can be performed at, for example, 200 mbar. Trimethylgallium, ammonia, and hydrogen can be used as the Ga source, nitrogen source, and carrier gas, respectively. A modified two-step growth can be employed to obtain flat GaN epitaxial films on the release layers 120. The first step can be carried out at a growth temperature of 1,100° C. for few minutes where guided nucleation at terrace edges can be promoted. The second growth step can be carried out at an elevated temperature of 1,250° C. to promote the lateral growth. Vertical GaN growth rate in this case can be around 20 nm per min.

In one example, the lattices of the growth substrates 110 are matched to the corresponding LED layers 130, in which case the growth substrates 110 function as seeds for the growth of the LED layers 130. For example, the epitaxial layer and the substrate can include the same semiconductor material. In these instances, the release layers 120 can be porous or thin enough (e.g., a single layer, or monolayer, of graphene). Sandwiching the release layers 120 between the growth substrates 110 and the LED layers 130 can facilitate quick and damage-free release and transfer of the LED layers 130.

In another example, a given release layer 120 can be thick enough (e.g., several layers of graphene) to function as a seed for growing the corresponding LED layer 130, in which case the LED layers 130 can be latticed-matched to the release layers 120. In yet another example, the growth substrates 110 together with the release layers 120 can function as the seeds to grow the LED layers 130.

Using graphene in a release layer 120 as a seed to fabricate the corresponding LED layer 130 can also increase the tolerance to mismatch between the lattice constants of the LED material and graphene. Without being bound by any particular theory or mode of operation, surfaces of two-dimensional (2D) materials (e.g., graphene) or quasi-2D layered crystals typically have no dangling bonds and interact with adjacent materials via weak van der Waals like forces. Due to the weak interaction, an epilayer can grow from the beginning with its own lattice constant forming an interface with a small amount of defects. This kind of growth is referred to as Van Der Waals Epitaxy (VDWE). The lattice matching condition can be drastically relaxed for VDWE, allowing a large variety of different heterostructures even for highly lattice mismatched systems. In practice, the lattice mismatch can be about 0% to about 70% (e.g., about 0%, about 10%, about 20%, about 30%, about 40%, about 50%, about 60%, and about 70%, including any values and sub-ranges in between).

The LED layers 130 can be transferred to the host substrate using a stressor layer. For example, a stressor layer (e.g., a high-stress metal film, such as Ni film) can be formed on a given LED layer 130, followed by formation of a tape layer on the stressor layer (see, e.g., FIGS. 6A-6F). The tape layer and the stressor layer can be used to mechanically exfoliate the LED layers 130 from the release layers 120 at a fast release rate by applying high strain energy to the interface between the LED layers 130 and the release layers 120. Without being bound by any particular theory, the release rate can be fast at least due to the weak van der Waals bonding between graphene and other materials such as the LED layers 130.

Once the LED layers 130 are placed on the host substrate, the tape layer and the stressor layer can be removed, leaving the LED layers 130 for further processing, such as formation of metal contacts. In some examples, the tape layer and the stressor layer can be etched away by a $FeCl_3$-based solution.

FIG. 2A shows a schematic of a vertically stacked LED device 200 that can be fabricated via the method 100 illustrated in FIGS. 1A-1D. The device 200 includes three LED layers 210, 220, and 230 vertically stacked to form an LED stack. The first LED layer 210 is configured to emit light at a first wavelength (e.g., about 580 nm to about 760 nm), the second LED layer 220 is configured to emit light at a second wavelength (e.g., about 490 nm to about 580 nm), and the third LED layer 230 is configured to emit light at a third wavelength (e.g., about 390 nm to about 490 nm). Light emitted by the three LED layers 210 to 230 is multiplexed to form output light 205 propagating along the optical axis of the device 200 (i.e., along they direction as illustrated in FIG. 2A). The device 200 also includes a reflector 240 (e.g., a nickel reflector) disposed on one end of the LED stack (e.g., coupled to the first LED layer 210) so as to cause the device 200 to emit light along only one direction (e.g., the y direction as in FIG. 2A).

Two encapsulation layers 250a and 250b are used to encapsulate the LED stack and the reflector 240. In one example, two separate layers can be used as the encapsulation layers 250a and 250b. In another example, the two encapsulation layers 250a and 250b can be part of a single encapsulation package that substantially encloses the LED stack and the reflector 240.

The device 200 can be used for various applications. For example, the device 200 can be used to construct an LED lighting device. The color of the output light 205 can be adjusted by changing the relative power of light emitted by the three LED layers 210 to 230. For example, voltages can be applied to each LED layer (i.e. 210, 220, and 230) separately, so the output light intensity of each LED layer can be controlled separately independently. As a result, the wavelength of the output light 205 can be adjusted.

In one example, the resulting LED lighting device can include multiple components, each of which is similar to the device 200, to form a lighting array. Different components in the array can be configured to emit light at different wavelengths. In another example, the LED lighting device can include only one component like the device 200. In this instance, the lateral dimension of the device 200 (e.g., the dimension along the x direction as illustrated in FIG. 2A) can be about 1 mm or greater (e.g., about 1 mm, about 2 mm, about 5 mm, about 10 mm, about 20 mm, or greater, including any values and sub ranges in between).

The device 200 can also be used for LED displays. The LED display can include multiple pixels (e.g., a 2D array of pixels), each of which can be similar to the device 200. In this instance, the wavelength of the output light 205 in each pixel can be controllable depending on the image displayed on the LED display.

Figure 2B:
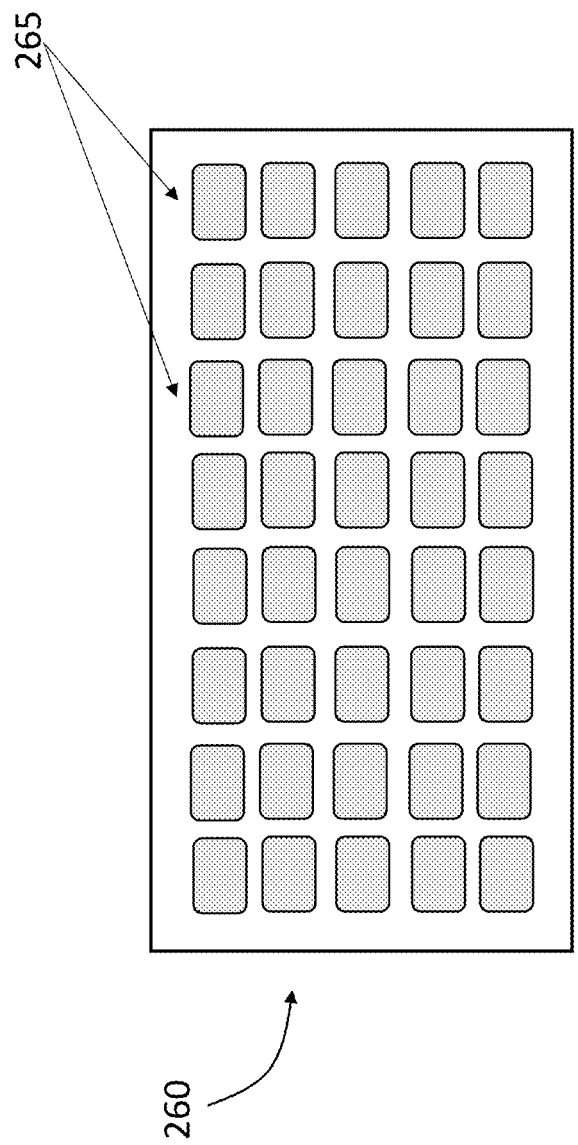
FIG. 2B shows a schematic of an apparatus including an array of vertically stacked LED devices shown in FIG. 2A.

FIG. 2B shows a schematic of an apparatus 260 including an array of vertically stacked LED devices 265. Each LED device 265 can be similar to the device 200 shown in FIG. 2A. In addition, each LED device 265 (i.e. each pixel) can be integrated with active matrix circuit that controls the operation of the LED device 265 (e.g. output color). The array shown FIG. 2B includes 5 rows and 8 columns. In practice, any other dimensions can also be used. For example, the apparatus 260 can be used as a display and the number of devices 265 in the array can be from about 100 to more than 1 million.

Methods of Fabricating LED Devices via Electrode Bonding

Figure 3G:
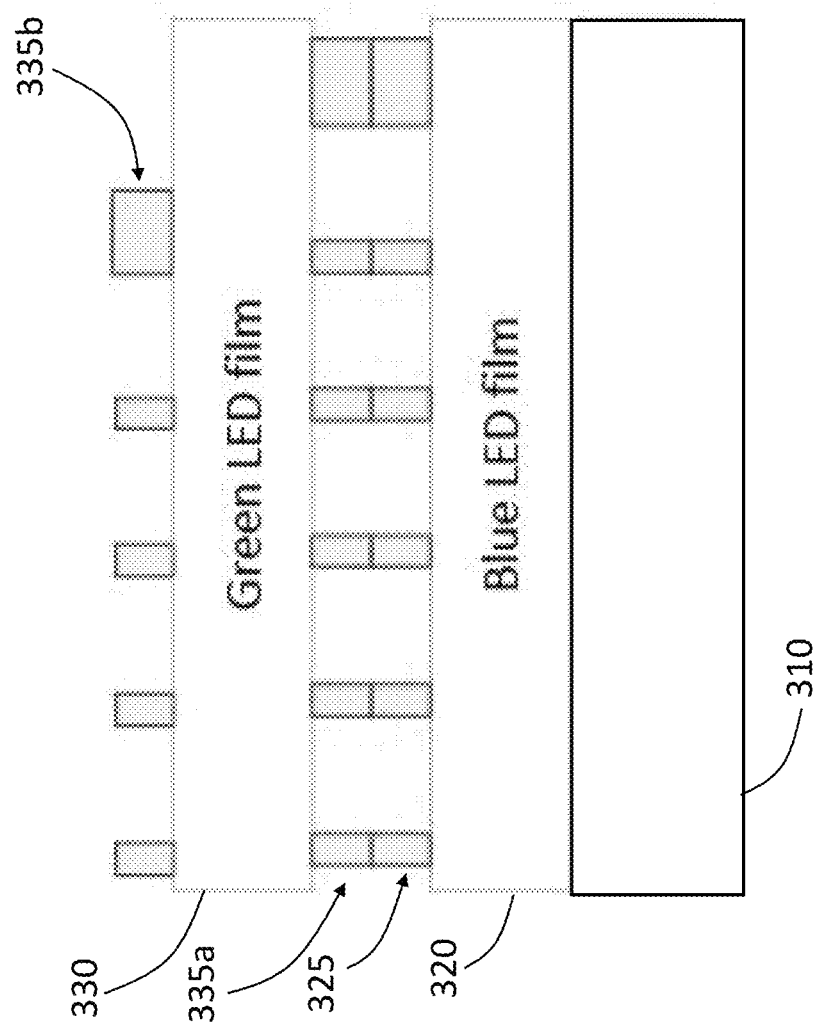

FIGS. 3A-3L illustrate a method 300 of fabricating vertically stacking LED devices via electrode bonding. In this method 300, as shown in FIG. 3A, a first LED layer 320 is disposed on a host substrate 310 using, for example, layer transfer techniques described herein. A first electrode layer 325 is then disposed on the first LED layer 320, as shown in FIG. 3B (top view) and FIG. 3C (side view). The first electrode layer 325 can be made of a metal (e.g., gold, silver, aluminum, etc.), a conductive oxide (e.g., indium tin oxide), carbon nanotubes, or any other conductive material. As shown in FIG. 3A, the first electrode layer 325 can include an array of conductive strips 326 along a first direction (e.g., x direction) and a bus strip 327 electrically coupling these conductive strips 326 and along a second direction (e.g., y direction) perpendicular to the first direction.

In FIG. 3D, a second LED layer 330 is fabricated and a second electrode layer 335a is disposed on the second LED layer 330. The second LED layer 330 and the second electrode layer 335a can be prepared on a separate substrate (not shown in FIG. 3D) and then transferred to the first LED layer 320. The second electrode layer 335a can be coupled to the first electrode layer 325 so as to couple together the second LED layer 330 with the first LED layer 320, as shown in FIG. 3E. In one example, the second electrode layer 335a can be welded (e.g. via cold welding) to the first electrode layer 325. In another example, the second electrode layer 335a can be bonded to the first electrode layer 325 via a conductive glue or a conductive tape. In yet another example, the second electrode layer 335a can be bonded to the first electrode layer 325 via thermocompression bonding or eutectic bonding.

Figure 3F:
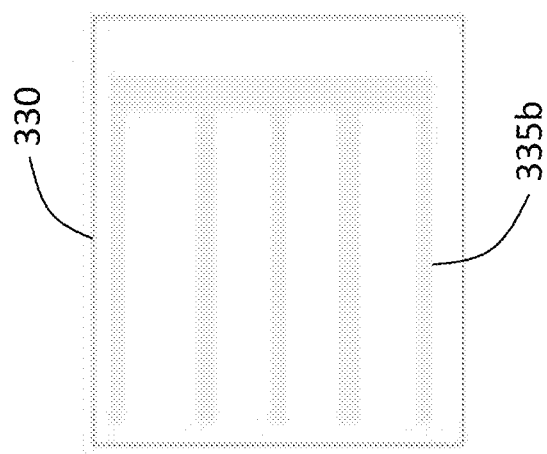

A third electrode layer 335b is then formed on the surface of the second LED layer 330, such that the two electrode layers 335a and 335b are disposed on opposite sides of the second LED layer 330, as illustrated in FIG. 3F (top view) and FIG. 3G (side view). In FIG. 3H, a third LED layer 340 and a fourth electrode layer 345 disposed on the third LED layer 340 are prepared on a separate substrate. The third LED layer 340 is then coupled to the second LED layer 330 (and the first LED layer 320) by coupling the fourth electrode layer 345 with the third electrode layer 335b, as shown in FIG. 3I.

Figure 3J:
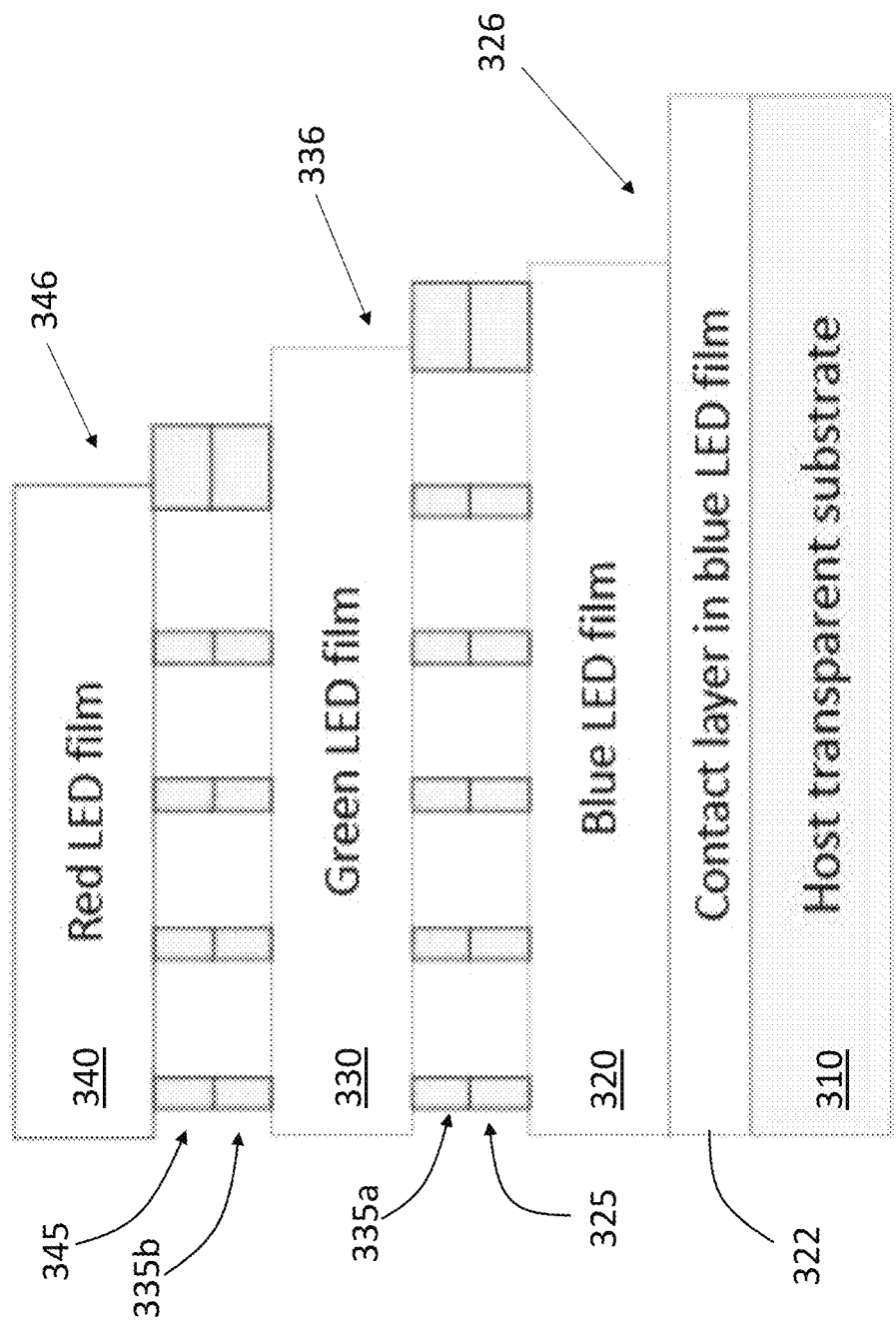

In FIG. 3J, mesas are patterned on the LED layers 320, 330, and 340. More specifically, a first mesa 326 is formed on the first LED layer 320, a second mesa 336 is formed on the second LED layer 330, and a third mesa 346 is formed on the third LED layer 340. The mesas 326 to 346 can be formed via, for example, selecting etching of the corresponding LED layer 320 to 340. FIG. 3J also shows a contact layer 322 disposed below the first LED layer 320. The contact layer 322 can be formed on the host substrate 310 before the first LED layer 320 is transferred to the host substrate 310.

Figures 3K, 3L:
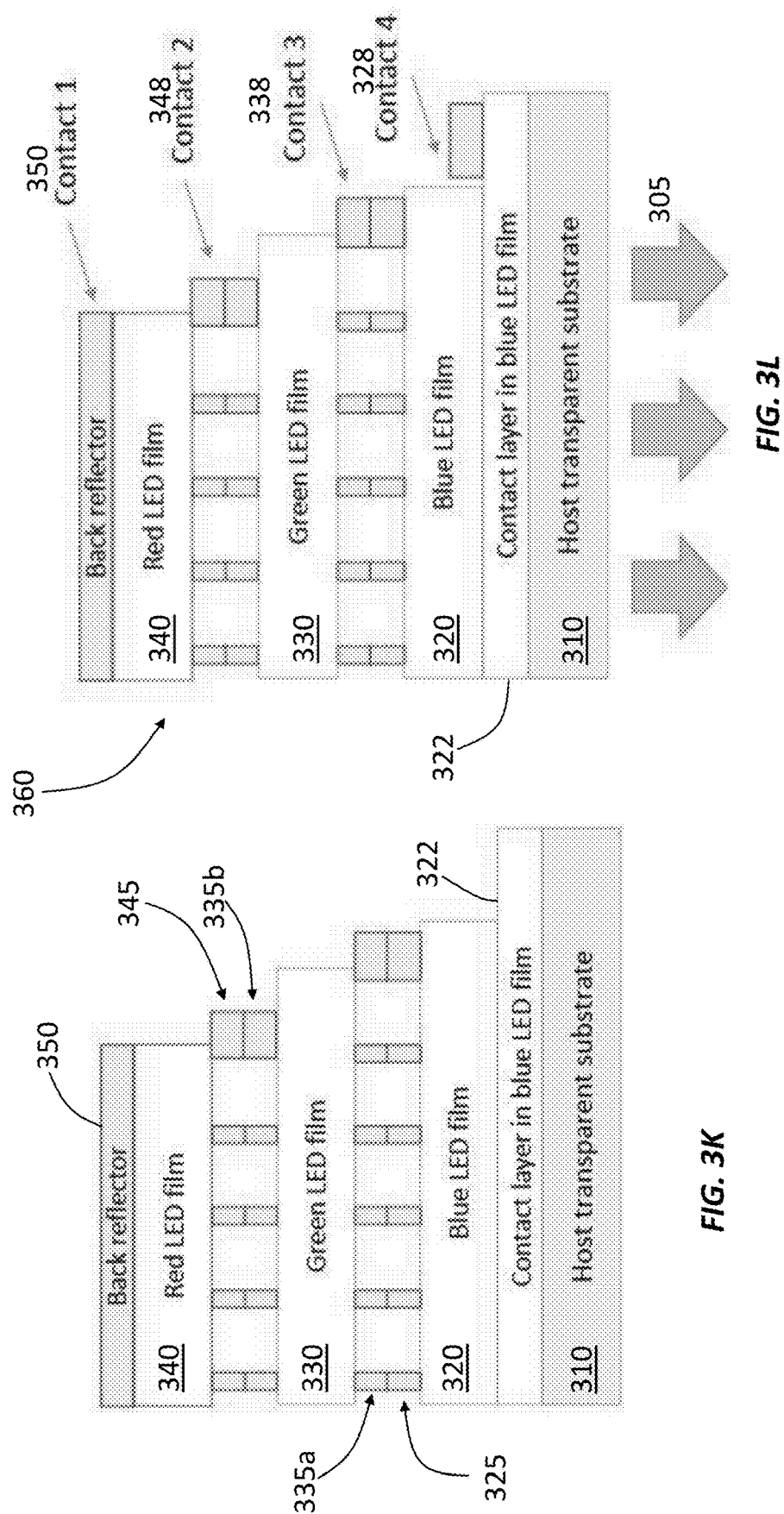

FIG. 3K shows that a back reflector 350 is formed on the third LED layer 340. The back reflector 350 can include a metal (e.g., gold, silver, aluminum, etc.) so that it can function as an electrode as well. In FIG. 3L, a first contact 328 is formed on the contact layer 322 and beside the first LED layer 320 to electrically connect the first LED layer 320 to external circuit, such as a power supply or control circuit. The second LED layer 330 also has a second contact 338, which can be the bus strips of the electrode layers 325 and 335a. Similarly, the third LED layer 340 has a third contact 348, which can be the bus strips of the electrode layers 335b and 345. As described above, the back reflector 350 can function as an electrical contact to couple the third LED layer 340 to external circuit.

As illustrated in FIG. 3K, the resulting device 360 can emit light 305 including the multiplexing of light emitted from the three LED layers 320, 330, and 340. The host substrate 310 can be substantially transparent to the output light 305 so as to pass through the output light 305. The host substrate 310 can also be flexible, in which case the device 360 can be used for wearable or stretchable LED devices. The host substrate 310 can include elastomer (e.g. for stretchable LED) or polymer and/or metal foil (e.g. for flexible devices).

Methods of Fabricating LED Devices Using Conductive Polymers

Figures 4A, 4B:
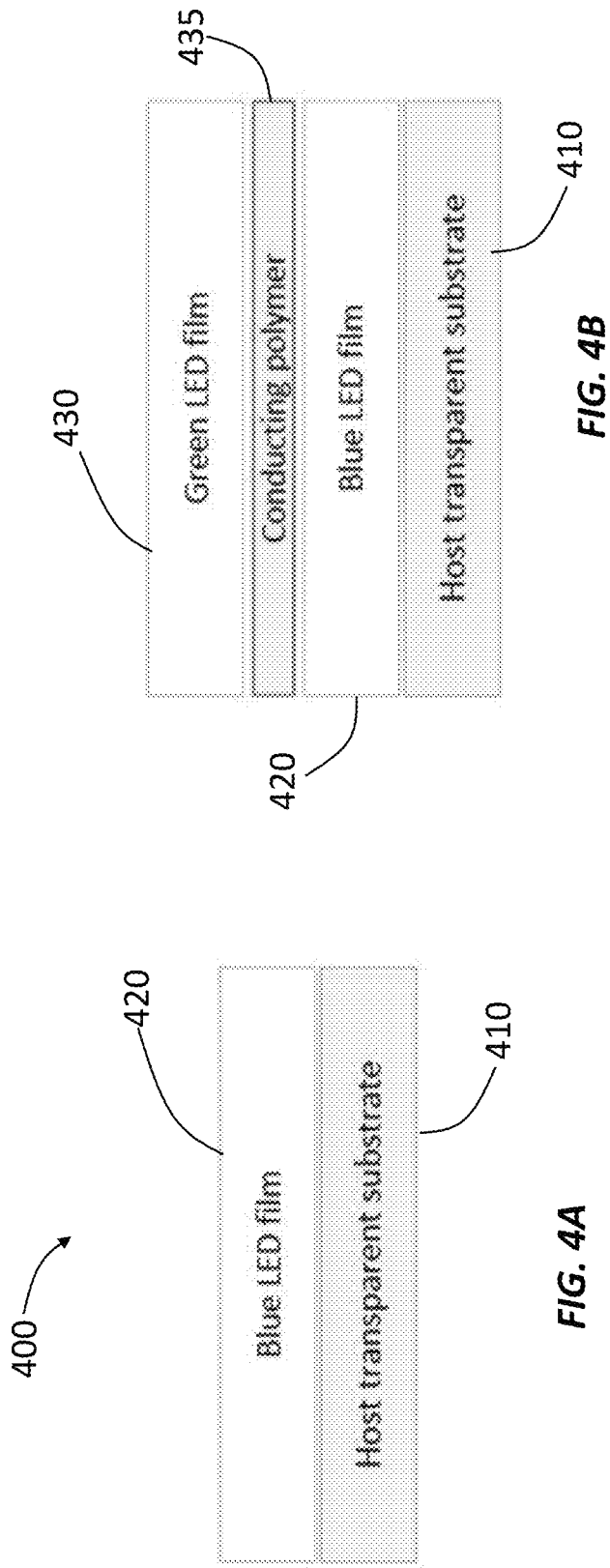

FIGS. 4A-4E illustrate a method 400 of fabricating vertically stacked LED devices using conductive polymers. FIG. 4A shows that a first LED layer 420 is formed on a host substrate 410 using, for example, layer transfer techniques described herein. A second LED layer 430 is then coupled with the first LED layer 420 via a first conductive polymer layer 435, as shown in FIG. 4B. The first conductive polymer layer 435 can be formed on the first LED layer 420 via, for example, spin coating. Alternatively, the first conductive polymer layer 435 can be formed on the second LED layer 430 and then transferred to the first LED layer 420. In FIG. 4C, a third LED layer 440 is coupled to the combination of the first LED layer 420 and the second LED layer 430 via a second conductive polymer layer 445. The three LED layers 420, 430, and 440 can be configured to emit light at three different wavelengths.

Figure 4E:
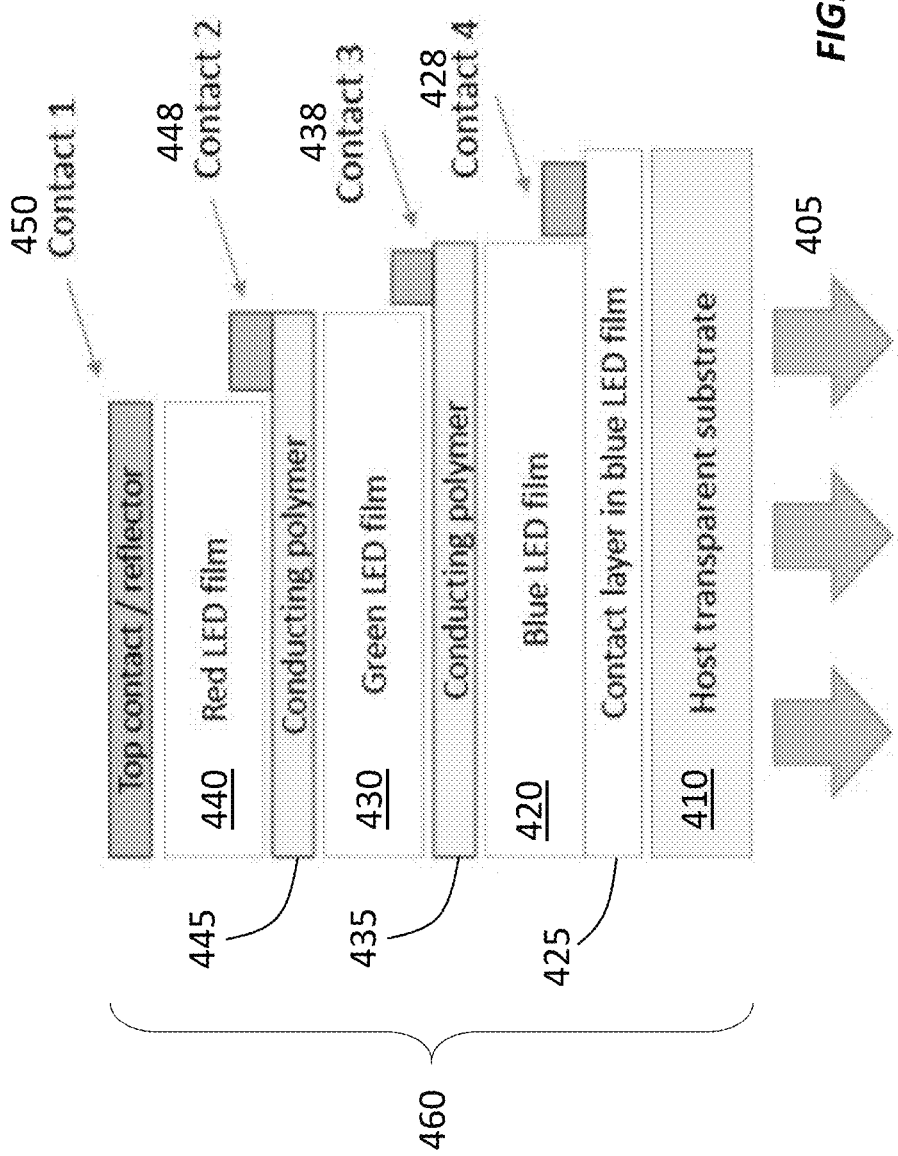

FIG. 4D shows that mesas 426, 436, and 446 are formed in the LED layers 420, 430, and 440, respectively. FIG. 4D also shows a contact layer 425 coupled to the first LED layer 420 to electrically couple the first LED layer 420 with external circuit. In FIG. 4E, a top reflector 450 is formed on the third LED layer 440 to reflect light back toward the first LED layer 420 as well as to function as an electrode. In addition, metal contacts 428, 438, and 448 are formed on the corresponding mesas 426, 436, and 446, respectively. The resulting device 460 is configured to emit output light 405 including the multiplexing of light emitted from the three LED layers 420, 430, and 440.

Vertically Stacked LED Devices including Transistors

Figure 5A:
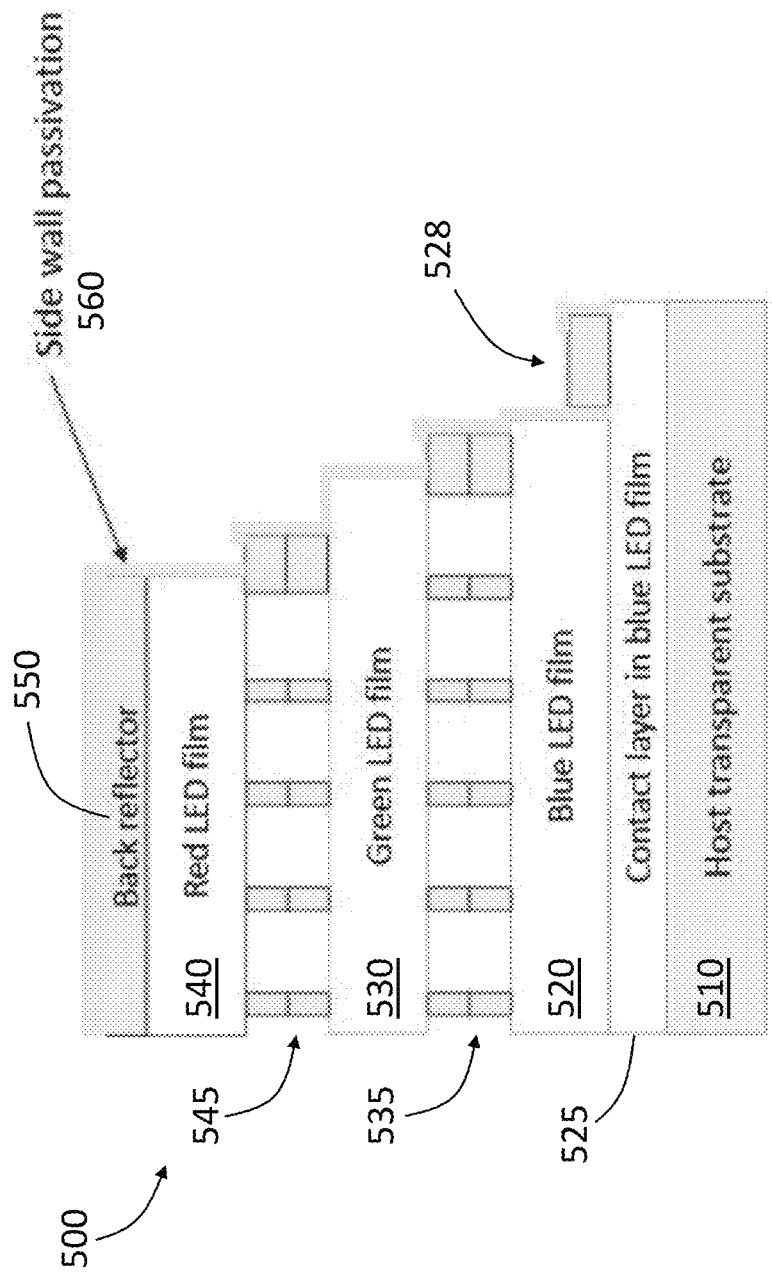
Figure 5C:
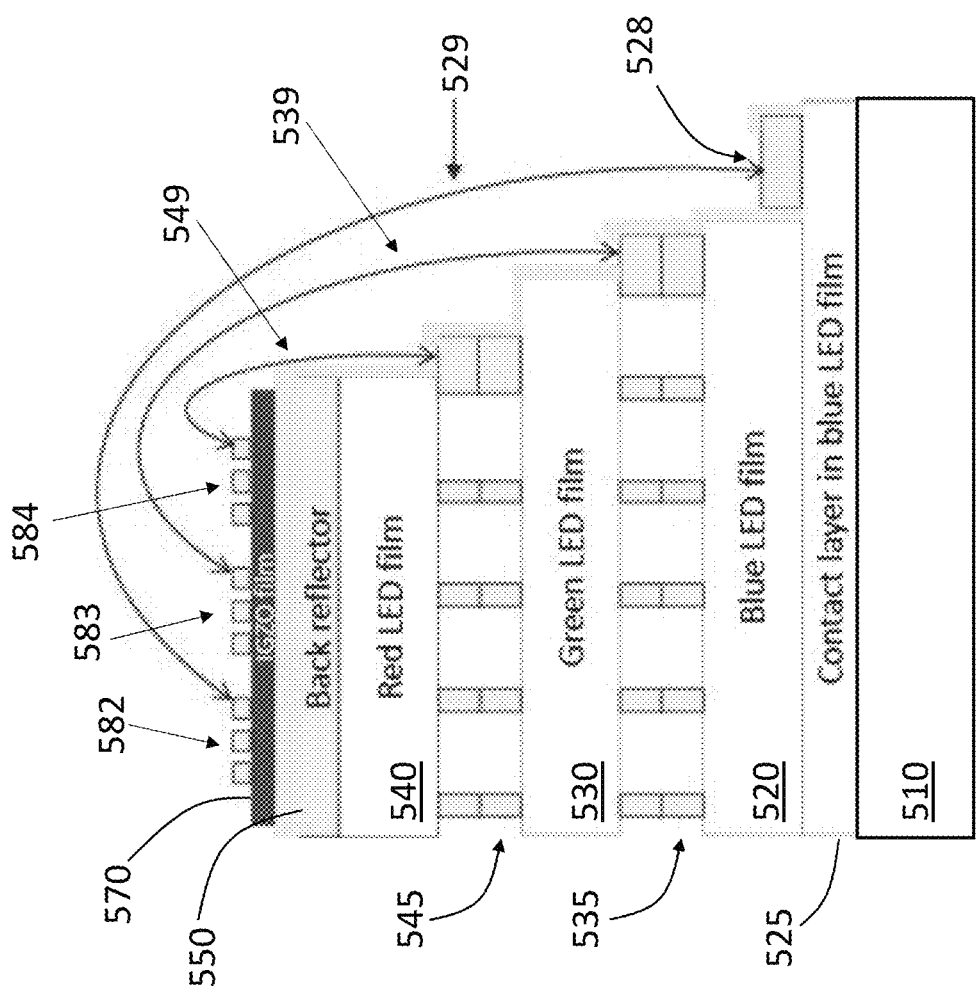

FIGS. 5A-5C show schematics of a vertically stacked LED device 500 including transistors to control the operation of the device 500. The device 500 includes a host substrate 510 and a first contact layer 525 disposed on the host substrate 510 to function as an electrode. Three LED layers 520, 530, and 540 are vertically stacked on the host substrate 510 and electrically coupled by two electrode layers 535 and 545. More specifically, the first LED layer 520 is disposed on the first contact layer 525, the second LED layer 530 is disposed on the first LED layer 520 via the first electrode layer 535, and the third LED layer 540 is disposed on the second LED layer 530 via the second electrode layer 545. A back reflector 550 is disposed on the third LED layer 540 to reflect light back toward the host substrate 510 as well as to function as an electrode. The device 500 also includes a passivation layer 560 disposed on the side walls of the LED layers 520, 530, and 540, as well as on the back reflector 550. The passivation layer 560 can include a dielectric material (e.g. polyimide or $SiO_2$, or SiN) and can be deposited via, for example, atomic layer deposition (ALD) techniques. A contact point 528 is disposed on the first contact layer 525 to facilitate the electrical coupling of the first LED layer 520 with external circuit. At least part of the device 500 (e.g., the structure shown in FIG. 5A less the passivation layer 560) can be fabricated using the method 300 illustrated in FIGS. 3A-3L.

In FIG. 5B, an indium gallium zinc oxide (IGZO) layer 570 is formed on the passivation layer 560 to allow fabrication of transistors for operation control. For example, the IGZO layer 570 can be used to fabricate thin film transistors (TFTs). The IGZO layer 570 can be fabricated using, for example, sputtering techniques. The IGZO layer 570 can also be replaced by amorphous silicon or any other metal oxide semiconductors.

In FIG. 5C, three transistors 582, 583, and 584 are formed. In one example, the three transistors 582, 583, and 584 share the same IGZO layer 570 as illustrated in FIG. 5C. In another example, three separate IGZO layers can be formed for the three transistors 582, 583, and 584. In one example, each transistor (582, 583, and 584) is a metal-oxide-semiconductor field-effect transistor (MOSFET) including three terminals: source terminal, drain terminal, and gate terminal. In another example, each transistor (582, 583, and 584) can be a conventional transistor including an emitter, a base, and a collector. The first transistor 582 is electrically connected to the first LED layer 520 via a first connection 529, the second transistor 583 is electrically connected to the second LED layer 530 via a second connection 539, and the third transistor 584 is electrically connected to the third LED layer 540 via a third connection 549. The connections 529, 539, and 549 can include conductive traces that pass through the passivation layer 260. Alternatively, vias can be used to connect the transistors 582, 583, and 584 to the Led layers 520, 530, and 540, respectively.

FIGS. 6A-6F illustrate a method 600 of fabricating a heterostructure that can be used for fabricating transistors (e.g., transistors 582-584 in the device 500 illustrated in FIGS. 5A-5C). The method 600 uses a graphene-based layer transfer technique. In FIG. 6A, a graphene layer 620 (e.g., a graphene monolayer) is disposed on a substrate 610 such as a SiC wafer. An h-BN layer 630 (i.e., hexagonal form boron nitride) is then epitaxially grown on the graphene layer 620. FIG. 6B shows that a stressor layer 640 (e.g., a nickel film) is coated on the h-BN layer 630 and a tape layer 650 is disposed on the stressor layer 640. As described before, the tape layer 650 and the stressor layer 640 can transfer the h-BN layer 630 to a second substrate including a silicon wafer 660 with an oxide layer 665 (e.g., silicon oxide) on the top, as illustrated in FIG. 6C. FIG. 6C also shows that the stressor layer 640 and the tape layer 650 are etched away, leaving the h-BN layer 630 for further processing.

In FIG. 6D, a $MoS_2$ layer 670 is deposited on the h-BN layer 630, and a second h-BN layer 680 is deposited on the $MoS_2$ layer 670 so as to form an h-BN/$MoS_2$ heterostructure. FIG. 6F shows that an $HfO_3$ layer 690 is deposited on the second h-BN layer 680 as a top gate dielectric and a top gate 695 is deposited on the $HfO_3$ layer 690 for electrical conduction. A source terminal 696 is formed on a first side of the $MoS_2$ layer 670 and a drain terminal is formed on a second side of the $MoS_2$ layer 670 so as to form a transistor. The $MoS_2$ layer 670 can also be replaced by an IGZO layer so as to form transistors like the transistors 582-584 shown in FIG. 5C.

Methods of Fabricating LED Devices Using Graphene-Based Layer Transfer

Figures 7E, 7F, 7G, 7H:
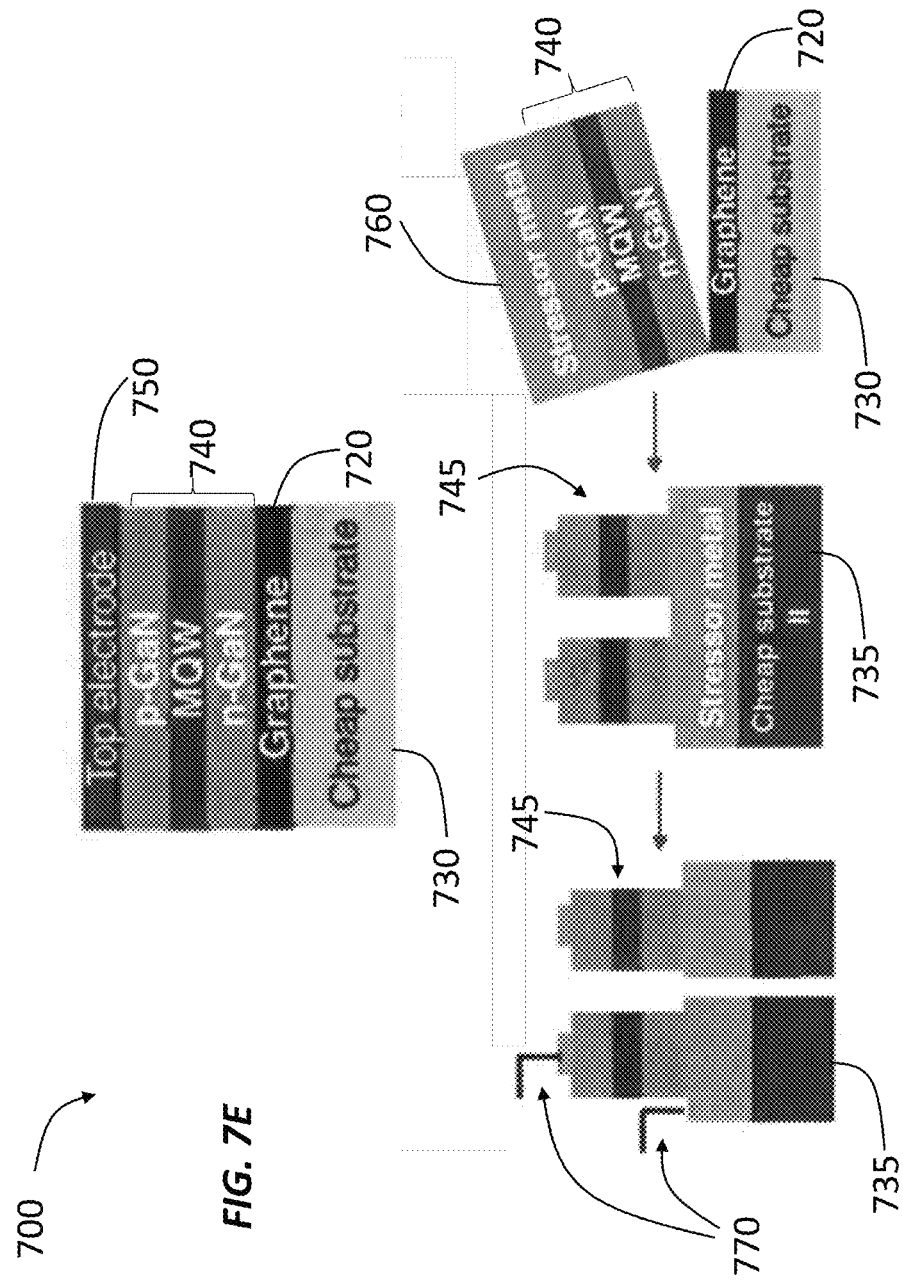

FIGS. 7A-7H illustrate a method 700 of LED devices using graphene-based layer transfer techniques. In FIG. 7A, a graphene layer 720 is grown on a substrate 710 (e.g., a 6" SiC substrate). Then the graphene layer 720 is released from the substrate 710, as shown in FIG. 7B, and transferred to a target substrate 730, as shown in FIG. 7C. The target substrate 730 can be less expensive than, for example, the SiC wafer used in FIG. 7A.

In FIG. 7D, an LED stack 740 (e.g., a visible LED stack) is fabricated on the graphene layer 720. In this example, the LED stack 740 includes three periods of III-nitride multi-quantum wells (InGaN well and GaN barrier) sandwiched between p-GaN and n-GaN layers. As readily appreciated by those of skill in the art, other types of LED stacks can also be grown on the graphene layer 720.

The fabricated LED stack 740 can then be processed in at least two ways. In one way, as illustrated in FIG. 7E, an electrode 750 can be deposited on the LED stack 740 to form an electrical contact. For example, thin Ni/Au (5 nm/5 nm) can be deposited on the LED stack 740 and then annealed at 500° C. for 10 min. This yields an LED that includes the substrate 730.

Alternatively, as illustrated in FIG. 7F, the LED stack 740 may be removed from the substrate 730. To remove the LED stack 740 from the substrate 730, a stressor layer 760 is disposed on the LED stack 740 to release the LED stack 740 from the target substrate 730 and the graphene 720. Then, the combination of stressor layer 760 and the LED stack 740 is flipped and placed on a second target substrate 735, as shown in FIG. 7G. The stressor layer 760 is in contact with the second target substrate 735 and the LED stack 740 is exposed for further processing. For example, FIG. 7G shows that LED mesas 745 are etched from the LED stack 740. In FIG. 7F, additional electrical contacts 770 are integrated with the LED mesas 745 and the stressor layer 760.

In one example, the graphene layer 720 can seed the growth of the LED stack 740 and the target substrate 730 may not have any effect on the growth of the LED stack 740. In another example, the graphene layer 720 can be thin and the target substrate 730 can seed the growth of the LED stack 740. The target substrate 730 can include GaN substrates.

The resulting LED stack 740 can be configured to emit light at a first wavelength and the method 700 illustrated in FIG. 7A-7H can be repeated to form a second LED stack configured to emit light at a second wavelength and a third LED stack configured to emit light at a third wavelengths. The three LED stacks can then be stacked again to form vertically stacked LED devices following procedures shown in, for example, FIGS. 1A-1D.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of fabricating a multicolor light-emitting diode (LED) display, the method comprising:
   forming a first LED layer on a first release layer comprising a first two-dimensional (2D) material disposed on a first substrate, the first LED layer being configured to emit light at a first wavelength;
   transferring the first LED layer from the first release layer to a host substrate;
   forming a second LED layer on a second release layer comprising a second 2D material disposed on a second substrate, the second LED layer being configured to emit light at a second wavelength;
   removing the second LED layer from the second release layer; and
   disposing the second LED layer on the first LED layer.

2. The method of claim 1, wherein forming the first LED layer comprises epitaxially growing the first LED layer on the first release layer.

3. The method of claim 1, wherein forming the first LED layer comprises epitaxially growing crystalline inorganic semiconductor on the first release layer.

4. The method of claim 3, wherein the first substrate comprises the crystalline inorganic semiconductor.

5. The method of claim 1, wherein the first 2D material comprises graphene.

6. The method of claim 5, wherein the second 2D material comprises graphene.

7. The method of claim 1, wherein the first 2D material is the same as the second 2D material.

8. The method of claim 1, wherein the host substrate is flexible and substantially transparent to the light at the first wavelength and the light at the second wavelength.

9. The method of claim 1, further comprising:
forming a third LED layer on a third release layer comprising a third 2D material disposed on a third substrate, the third LED layer being configured to emit light at a third wavelength;
removing the third LED layer from the third release layer; and
disposing the third LED layer on the second LED layer.

10. The method of claim 9, wherein the first wavelength is in a range of about 580 nm to about 760 nm, the second wavelength is in a range of about 490 nm to about 580 nm, and the third wavelength is in a range of about 390 nm to about 490 nm.

11. The method of claim 9, wherein the first LED layer has a first side wall, the second LED layer has a second side wall, the third LED layer has a third side wall and a top surface, and the method further comprises:
forming a passivation layer on the first side wall, the second side wall, the third side wall, and the top surface of the third LED layer.

12. The method of claim 11, further comprising:
forming a first transistor, a second transistor, and a third transistor on the passivation layer;
electrically connecting the first transistor to the first LED layer;
electrically connecting the second transistor to the second LED layer; and
electrically connecting the third transistor to the third LED layer.

13. The method of claim 12, wherein forming the first transistor comprises:
forming an indium gallium zinc oxide (IGZO) layer above the third LED layer; and
forming a first base electrode, a first emitter electrode, and a first collector electrode on the IGZO layer.

14. The method of claim 9, further comprising:
forming a fourth LED layer on the first release layer after transferring the first LED layer to the host substrate, the fourth LED layer being configured to emit light at the first wavelength.

15. The method of claim 1, further comprising:
forming a first electrode layer on the first LED layer; and
forming a second electrode layer on the second LED layer,
wherein disposing the second LED layer on the first LED layer comprises bonding the first electrode layer with the second electrode layer.

16. The method of claim 15, wherein forming the first electrode layer comprises forming a first array of metal strips on the first LED layer and forming the second electrode layer comprises forming a second array of metal strips on the second LED layer.

17. The method of claim 1, further comprising:
depositing conductive polymer on the first LED layer,
wherein disposing the second LED layer on the first LED layer comprises disposing the second LED layer on the conductive polymer.

18. The method of claim 1, wherein the host substrate is substantially transparent to the light at the first wavelength and the light at the second wavelength.

* * * * *